US011430880B2

(12) United States Patent
Kim

(10) Patent No.: US 11,430,880 B2
(45) Date of Patent: Aug. 30, 2022

(54) INSULATED GATE BIPOLAR TRANSISTOR AND METHOD OF MANUFACTURING SAME

(71) Applicant: DB HiTek Co., Ltd., Seoul (KR)

(72) Inventor: Young-Seok Kim, Seongnam-si (KR)

(73) Assignee: DB HiTek, Co., Ltd., Seoul (KR)

( * ) Notice: Subject to any disclaimer, the term of this patent is extended or adjusted under 35 U.S.C. 154(b) by 49 days.

(21) Appl. No.: 16/891,488

(22) Filed: Jun. 3, 2020

(65) Prior Publication Data
US 2021/0384329 A1 Dec. 9, 2021

(51) Int. Cl.
*H01L 29/739* (2006.01)
*H01L 29/66* (2006.01)
*H01L 29/417* (2006.01)

(52) U.S. Cl.
CPC .... *H01L 29/7396* (2013.01); *H01L 29/41708* (2013.01); *H01L 29/66348* (2013.01)

(58) Field of Classification Search
CPC ........... H01L 29/7396; H01L 29/41708; H01L 29/66348; H01L 2924/13055; H01L 29/66325–66348; H01L 29/7393–7398; H01L 29/083–0839
See application file for complete search history.

(56) References Cited

U.S. PATENT DOCUMENTS

| | | | |
|---|---|---|---|
| 2012/0025874 A1* | 2/2012 | Saikaku | H01L 29/7397 327/109 |
| 2014/0339599 A1* | 11/2014 | Onozawa | H01L 29/407 257/139 |
| 2017/0278956 A1* | 9/2017 | Tsuyuki | H01L 29/66348 |
| 2020/0105874 A1* | 4/2020 | Yilmaz | H01L 29/063 |
| 2020/0303507 A1* | 9/2020 | Yilmaz | H01L 29/7832 |
| 2021/0159315 A1* | 5/2021 | Okamoto | H01L 29/7397 |

FOREIGN PATENT DOCUMENTS

KR 20090070516 A 7/2009

* cited by examiner

*Primary Examiner* — Shahed Ahmed
(74) *Attorney, Agent, or Firm* — Andrew D. Fortney; Central California IP Group, P.C.

(57) ABSTRACT

The present disclosure relates to an insulated gate bipolar transistor (IGBT) and, more particularly, to an insulated gate bipolar transistor, in which a barrier region is in a mesa between adjacent trench gates to divide the width of the mesa, thereby inducing the accumulation of hole carriers, and thus reducing an on-resistance (e.g., of the IGBT).

6 Claims, 11 Drawing Sheets

INSULATED GATE BIPOLAR TRANSISTOR AND METHOD OF MANUFACTURING SAME

BACKGROUND OF THE INVENTION

Field of the Invention

The present invention relates to an insulated gate bipolar transistor (IGBT) and, more particularly, to a bipolar transistor in which a barrier region in a mesa in the space between adjacent trench gates divides the width of the mesa, thereby inducing the accumulation of hole carriers (i.e., holes), and thus reducing an on-resistance (e.g., the internal resistance of the IGBT when it is in a fully conducting state).

Description of the Related Art

An insulated gate bipolar transistor (IGBT) is an ideal device that combines an insulated gate structure of a MOS transistor with the high current density capability of a bipolar transistor.

Specifically, an insulated gate bipolar transistor has an advantage of bipolar operation, which can significantly reduce on-resistance by conductivity modulation.

FIG. 1 is a cross-sectional view of an insulated gate bipolar transistor in the related art; and FIG. 2 is a graph showing that the conductivity modulation changes according to the width of the mesa.

Referring to FIG. 1, an IGBT technology in the related art was developed to maximize conductivity modulation, and for this purpose, it is common to store hole carriers (i.e., holes) inside a bipolar transistor, such as IGBT 9. In order to maximize conductivity modulation, it is common to induce the buildup of hole carriers, and thus accumulate the hole carriers, by reducing the width of the mesa M between a pair of adjacent trench gates 910.

Therefore, to induce the accumulation of the hole carriers as described above, the width of the mesa M must be below a predetermined value. However, it is difficult to secure enough space to form an emitter 930, an ion implantation region 950, and/or a pad 970, which typically require more detailed and/or complicated subsequent processing. For example, when the distance between the adjacent trench gates 910 is too short, there is a possibility that the resist pattern for forming the emitter 930 and/or ion implantation region 950 is ineffective or changes so that the desired pattern is not formed. Therefore, the method of narrowing the width of the mesa M in the related art is inevitably a factor that increases processing costs and time.

In order to solve this problem, the present invention provides an insulated gate bipolar transistor and a method of manufacturing the same, where the transistor has sufficient distance between adjacent trench gates in the MOSFET operating region to facilitate relatively easy subsequent processing, while still inducing the accumulation of hole carriers.

SUMMARY OF THE INVENTION

Accordingly, the present invention has been made keeping in mind the above problems occurring in the prior art, and an objective of the present invention is to provide an insulated gate bipolar transistor and a method of manufacturing the same, in which a barrier region that includes a high concentration impurity region having a first conductivity type is between a pair of adjacent trench gates, in order to maximize conductivity modulation and effectively reduce the width of the mesa between the adjacent trench gates (e.g., in the course of inducing the accumulation of hole carriers). As a result, it is possible to decrease the processing costs and processing time due to difficulty in forming the emitter and other structures in the mesa.

In addition, an objective of the present invention is to provide an insulated gate bipolar transistor and a method of manufacturing the same, in which first and second current paths are between adjacent trench gates and the barrier region, and widths of the first and second current paths (e.g., the sum of such widths) may be smaller than or equal to the width of the current path in the existing mesa (e.g., an otherwise identical mesa in an otherwise identical IGBT, but without the barrier region), thereby further maximizing the conductivity modulation.

In addition, an objective of the present invention is to provide an insulated gate bipolar transistor and a method of manufacturing the same, in which a plurality of barrier regions are between adjacent trench gates, whereby it is possible to easily secure sufficient space in the mesa for subsequent processing, and at the same time, to easily induce the accumulation of hole carriers.

In addition, an objective of the present invention is to provide an insulated gate bipolar transistor and a method of manufacturing the same, in which hole carriers (i.e., holes) can easily move (e.g., into the mesa) by forming an ion implantation region having a first conductivity type with a concentration higher than that of the impurity concentration in the body region, thereby achieving a faster switching speed.

The present invention can be implemented by various embodiments having the following configurations to achieve the above-described objectives.

According to embodiments of the present invention, an insulated gate bipolar transistor according to the present invention includes a collector electrode; a collector layer on the collector electrode, the collector layer having a first conductivity type; a buffer layer on the collector layer, the buffer layer having a second conductivity type; a drift region on the buffer layer, the drift region having the second conductivity type; a body region on the drift region, the body region having the first conductivity type; a plurality of trench gates penetrating the body region (e.g., from a surface of the body region); an interlayer insulating film covering a surface of the trench gates; emitters spaced apart from each other on a surface of the body region, the emitters having the second conductivity type; and a barrier region in a mesa between adjacent trench gates, the barrier region being configured to divide a width of the mesa.

According to one or more other embodiments of the present invention, the barrier region may be a high concentration impurity region having the first conductivity type.

According to at least one other embodiment of the present invention, the barrier region may have a height that entirely or partially overlaps with the trench gates.

According to at least one other embodiment of the present invention, the IGBT may comprise a plurality of barrier regions between the adjacent trench gate.

According to at least one other embodiment of the present invention, adjacent ones of the barrier regions may be separated by substantially the same distance.

According to at least one other embodiment of the present invention, the transistor may further include an ion implantation region having the first conductivity type having opposite ends or sides in contact or partially overlapping with the emitters and a bottom portion or surface that is in contact with the body region; and a polysilicon emitter electrode on the ion implantation region, or alternatively, on a surface of a device containing the emitter and the ion implantation region.

According to other embodiments of the present invention, an insulated gate bipolar transistor according to the present invention includes a collector electrode; a collector layer on the collector electrode, the collector layer having a first conductivity type; a buffer layer on the collector layer, the buffer layer having a second conductivity type; a drift region on the buffer layer, the drift region having the second conductivity type; a body region on the drift region, the body region having the first conductivity type; a plurality of trench gates penetrating the body region (e.g., from a surface of the body region); an interlayer insulating film covering a surface of the trench gates; emitters spaced apart from each other on a surface of the body region, the emitters having the second conductivity type; a polysilicon emitter electrode on the emitters (e.g., a surface of a device containing the emitters); and a barrier region in a mesa between adjacent trench gates, wherein the barrier region has a high concentration of the first conductivity type impurities and is configured to divide a width of the mesa to form first and second current paths.

According to at least one other embodiment of the present invention, the trench gates may include a gate insulating film (e.g., having a substantially U shape or cross-section) along a boundary thereof, and a gate electrode doped with a second conductivity type impurity on (e.g., an inner wall of) the gate insulating film.

According to at least one other embodiment of the present invention, the barrier region may be substantially at or in a center (e.g., of the space) between the adjacent trench gates.

According to at least one other embodiment of the present invention, the transistor may further include an ion implantation region having opposite ends or sides in contact or partially overlapping with the emitters and a bottom portion or surface in contact with the body region, wherein the ion implantation region is a high concentration impurity region of the first conductivity type.

According to at least one other embodiment of the present invention, each of the first and second current paths may have a width suitable to induce accumulation of hole carriers, and thus accumulate the hole carriers.

According to at least one other embodiment of the present invention, a sum of the widths of the first and second current paths and the barrier region may prevent a resist pattern for forming the emitters and/or the ion implantation region from being changed.

According to at least one other embodiment of the present invention, a method of manufacturing an insulated gate bipolar transistor according to the present invention includes forming a buffer layer on a substrate having a first conductivity type; forming a drift region to a first height on the buffer layer; forming a barrier region by implanting a high concentration of the first conductivity type impurity through a surface of the drift region; elongating the drift region (e.g., from above the drift region); forming a body region on the elongated drift region; forming a resist pattern on a surface of the body region, and implanting a high concentration of a second conductivity type impurity in the surface of the body region using the pattern as a mask to form an emitter; and forming a trench gate by penetrating the body region (e.g., from the surface of the body region).

According to at least one other embodiment of the present invention, forming the trench gate may include forming an etching mask on the emitter and etching through an opening (e.g., in the etching mask) to form a trench penetrating the body region; forming a gate insulating film (e.g., an oxide film) along an inner wall of the trench; and filling a remainder of the trench with polysilicon doped with the second conductivity type impurity.

According to at least one other embodiment of the present invention, the method may further include forming a resist pattern on a surface (e.g., other than the ion implantation region) and implanting the high concentration of the first conductivity type impurity using the pattern as a mask to form an ion implantation region. The ion implantation region may have a lowermost surface in contact with the body region.

According to at least one other embodiment of the present invention, the method may form a plurality of barrier regions between the adjacent trench gates.

According to at least one other embodiment of the present invention, the distance between adjacent trench gates may be suitable to prevent a resist pattern for forming the emitter region and/or the ion implantation region from being changed.

According to other embodiments of the present invention, a method of manufacturing an insulated gate bipolar transistor according to the present invention includes forming a buffer layer on a substrate of a first conductivity type; forming a drift region by epitaxial growth to a first height on the buffer layer; forming a barrier region through a surface of the drift region; elongating the drift region to a second height by epitaxial growth (e.g., from the drift region); forming a body region on the elongated drift region; forming a resist pattern on a surface of the body region, and implanting a high concentration of a second conductivity type impurity in a surface of the body region using the pattern as a mask to form an emitter; and forming a trench gate by penetrating the body region (e.g., from the surface of the body region).

According to at least one other embodiment of the present invention, forming the barrier region may include forming a resist pattern on a surface of the drift region (e.g., up to the first height), and implanting a high concentration of the first conductivity type impurity in the surface of the drift region through an opening in the pattern (e.g., to form one or more barrier regions).

According to at least one other embodiment of the present invention, the barrier region(s) may be or comprise a high concentration region of the first conductivity type impurity.

The present invention has the following effects by the above configuration.

According to the present invention, a barrier region, which is a high concentration impurity region having the first conductivity type, is between a pair of adjacent trench gates in order to maximize conductivity modulation, effectively reducing the width of the mesa between the adjacent trench gates to induce the accumulation of and accumulate hole carriers, whereby an increase in processing costs and processing time due to insufficient space when forming an emitter or the like in the mesa.

In addition, according to the present invention, first and second current paths are formed between adjacent trench gates and the barrier region, and the first and second current paths may have a width smaller than or equal to the width of the current path in the existing (e.g., related art) mesa, whereby there is an effect of maximizing the conductivity modulation.

In addition, according to the present invention, a plurality of barrier regions may be formed between adjacent trench gates, whereby there is an effect of easily securing sufficient space for subsequent processing, and at the same time, easily inducing the accumulation of hole carriers.

In addition, according to the present invention, hole carriers can easily move in the presence of an ion implantation region in the lower portion of the mesa, the ion implantation region having a higher concentration of first conductivity type impurities than the body region, whereby there is an effect of achieving a faster switching speed.

Even if not explicitly mentioned herein, the effects described in the following specification, or that are expected or provided by the technical features of the present invention, and the potential effects thereof are considered as being described in the present specification.

BRIEF DESCRIPTION OF THE DRAWINGS

The above and other objects, features, and other advantages of the present invention will be more clearly understood from the following detailed description when taken in conjunction with the accompanying drawings, in which.

DETAILED DESCRIPTION OF THE INVENTION

Hereinafter, embodiments of the present invention will be described in detail with reference to the accompanying drawings. The described embodiments of the present invention can be modified in various forms, and the scope of the present invention should not be interpreted as being limited to the following embodiments, but should be interpreted based on the claims. Further, the present embodiments described herein are provided only as a reference for more fully illustrating the present invention to those skilled in the art.

In the following description, one element being "on", "on the top of", "on an upper [or uppermost] side of", or "above" another element refers to the element being either in contact with a surface of another element, or at a certain distance from the other element. In the case where the one element is a certain distance from the other element, one or more other elements may be between the two elements. Further, when one element is "directly on" another element or "just above" the other element, one or more other elements can be between the two elements.

In addition, it should be noted that although "first" and "second" components are described below, the "second" component is not intended to be a premise of or to require the "first" component, but rather, is merely for the sake of explanation.

Meanwhile, when feasible, the functions or operations specified in a particular block or sequence may occur in a different order than those described (e.g., in a flow or flowchart. For example, the functions or operations of two consecutive blocks or processes may be performed substantially simultaneously, or may be performed in reverse order.

In embodiments described below, the first conductivity type may be, for example, P-type, and the second conductivity type may be, for example, N-type, but are not limited thereto.

Figure 3:
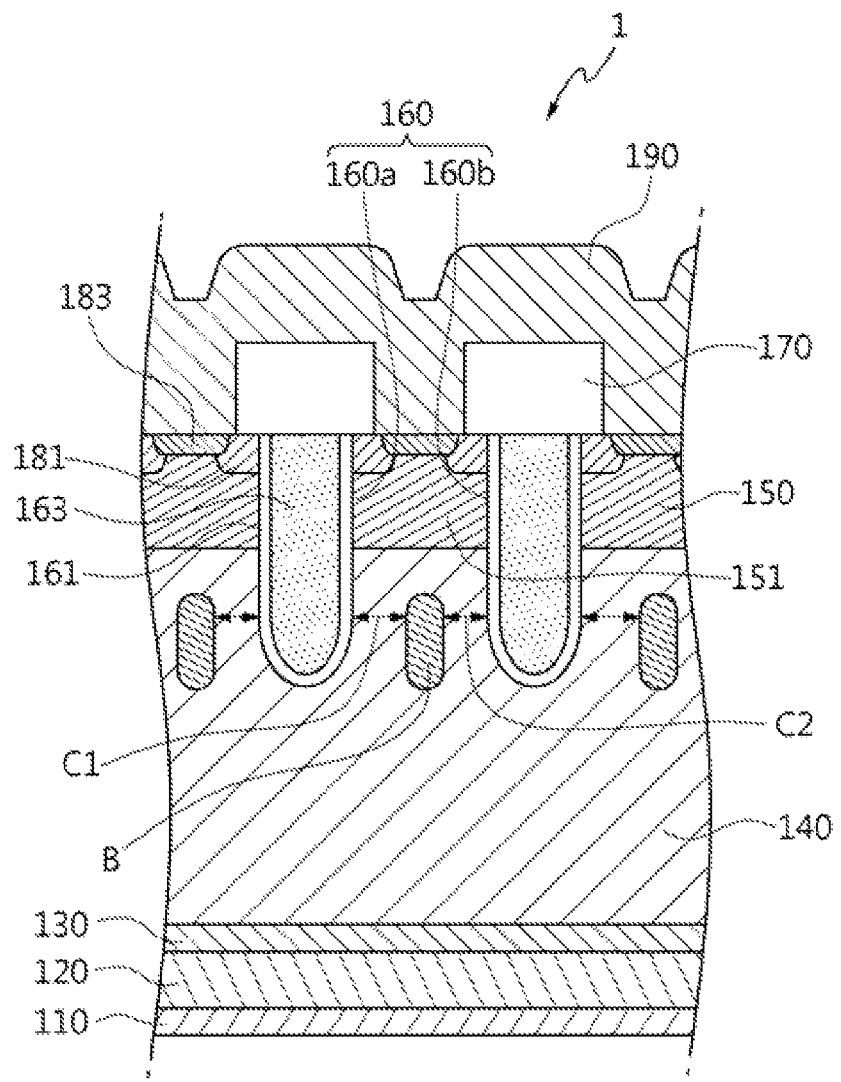
FIG. 3 is a cross-sectional view showing an exemplary insulated gate bipolar transistor according to one or more embodiments of the present invention.
Figure 4:
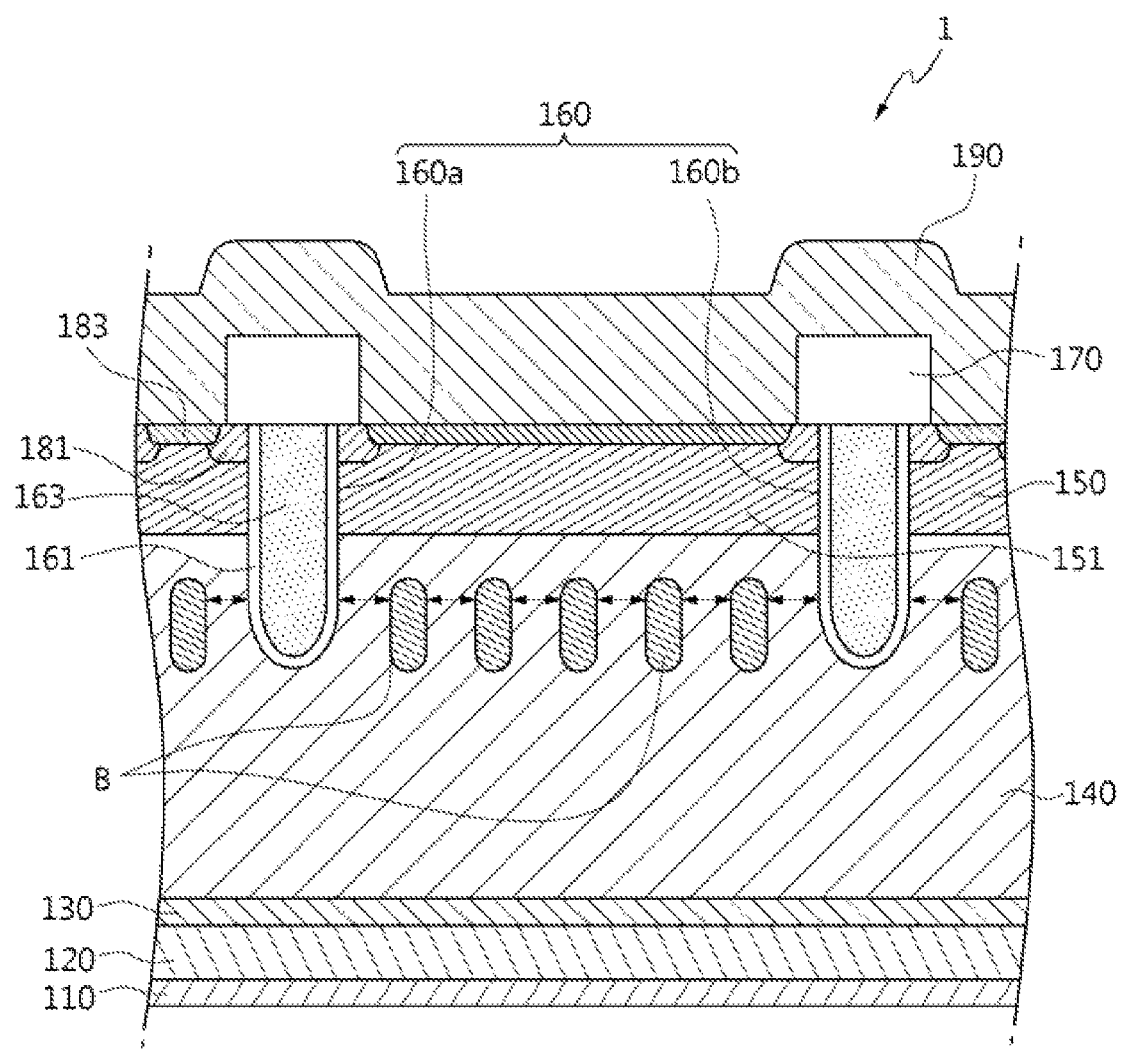
FIG. 4 is a cross-sectional view showing an exemplary insulated gate bipolar transistor, according to at least one other embodiment of the present invention.

FIG. 3 is a cross-sectional view showing an exemplary insulated gate bipolar transistor according to various embodiments of the present invention; and FIG. 4 is a cross-sectional view showing an exemplary insulated gate bipolar transistor according to one or more other embodiments of the present invention.

Hereinafter, the insulated gate bipolar transistor according to various embodiments of the present invention will be described in detail with reference to the accompanying drawings.

Referring to FIG. 3, the present invention relates to an exemplary insulated gate bipolar transistor (IGBT) 1 and, more specifically, to a bipolar transistor in which a barrier region B is in a mesa M in the space between adjacent trench gates 160a-b to divide the width of the mesa M, thereby inducing the accumulation of hole carriers (i.e., holes), and thus reducing an on-resistance (e.g., of the IGBT).

First, a collector electrode 110 comprising, for example, an aluminum alloy such as AlMoNiAu alloy, is on a lowermost side or surface of the insulated gate bipolar transistor 1, and a collector layer 120, which is a high concentration impurity region having a first conductivity type, is on the collector electrode 110. The collector layer 120 is a semiconductor layer. A buffer layer 130, which may be a high concentration region of a second conductivity type impurity, is on the collector layer 120. In addition, a drift region 140, which is an impurity region having the second conductivity type, is on the buffer layer 130. As will be described later, the collector layer 120, the buffer layer 130, and the drift region 140 may be formed using, for example, an epitaxial process, but their formation is not limited thereto.

A body region 150, which is an impurity region having the first conductivity type is on the drift region 140. The channel region 151 is in the body region 150. When the gate voltage turns on the IGBT, the channel region 151 is inverted to a second conductivity type region to form a current path.

In addition, a trench gate 160 penetrates the body region 150 from the surface of the body region 150 (or, more specifically, from the surface of the ion implantation region 183 and/or the emitter 181). The trench gate 160 has a bottom or lowermost portion that partially penetrates the drift region 140.

The trench gate 160 has a gate insulating film 161 having a U-shaped cross-section along a boundary thereof, and a gate electrode 163 on or within the inner wall or surface of the gate insulating film 161. For example, the gate insulating film 161 may be or comprise a silicon oxide layer, and the gate electrode may be or comprise a polysilicon film doped with a second conductivity type impurity. As described above, the plurality of trench gates 160a-b are spaced apart from each other by a predetermined distance.

In addition, an otherwise exposed surface of the trench gates 160a-b is covered with an interlayer insulating film 170, and an emitter electrode 190 is on the surface of the device, which includes an emitter 181 and an ion implantation region 183, which will be described later. The interlayer insulation film 170 is between the gates 160 and the emitter electrode 190. The emitter electrode 190 may be or comprise, for example, a polysilicon film.

In addition, emitters 181, which are high concentration impurity regions having the second conductivity type, are spaced apart from each other on the surface of the body region 150 and may have, for example, a band shape. The emitter 181 has one end or side that is in contact with one side of the gate insulating film 161, and another end or side that is in contact with or that overlaps the ion implantation region 183, which is a region having a high concentration of the first conductivity type impurity.

The ion implantation region 183 may have opposite ends or sides that are in contact or partially overlapping with the emitter 181, and the bottom portion or bottommost surface thereof is in contact with the body region 150. The impurity concentration of the ion implantation region 183 is higher than the impurity concentration of the body region 150, and the hole carriers can easily move through the ion implantation region 183, whereby the switching speed becomes faster.

Hereinafter, before describing the barrier region B, an operation method and problems of the insulated gate bipolar transistor in the related art will be described in detail.

First, when a gate voltage is applied to the gate electrode 163, and a voltage differential exists between the gate electrode 163 and the emitter electrode 190, the IGBT turns on, and the channel region 151 inverts to form a current path. Electrons are injected from the emitter electrode 190 to the drift region 140 through the channel region 151, and the holes are injected from the collector electrode 110 to the drift region 140.

Conduction modulation may occur as a result of injection of the electrons and/or the holes, as the holes may be generated from the collector electrode 110. The resistance of the drift region 140 may significantly decrease, and the current capacity may increase, as the number of holes (e.g., in the drift region 140) increases due to conductivity modulation.

When the gate is turned off, the inverted channel region 151 returns or inverts back to the first conductivity type, and the injection of electrons from the emitter electrode 190 stops. Then, the electrons accumulated in the drift region 140 flow to the collector electrode 110, and the hole carriers flow to the emitter electrode 190.

In the course of such an operation, it is common to accumulate and/or concentrate the hole carriers by reducing the width of the mesa M between adjacent trench gates 160a-b, in order to maximize the conductivity modulation. Therefore, in order to induce the accumulation of hole carriers, the width of the mesa M should be below a predetermined value, as described above. However, when the width of the mesa M is below the predetermined value, it is difficult to form the emitter 181, the ion implantation region 183, and/or emitter electrodes 190, which results in more detailed and complicated subsequent processing. This inevitably causes an increase in the processing costs and processing time.

In order to solve this problem, the insulated gate bipolar transistor according to embodiments of the present invention is characterized in that a barrier region B is in the mesa (M) between a pair of adjacent trench gates 160. The barrier region B may be, for example, a region having a high concentration of first conductivity type impurities. It is preferable that the barrier region B is between adjacent trench gates 160a-b in the drift region 140, and that the barrier region B is at a height in the drift region 140 and/or the mesa M that entirely or partially overlaps with the trench gate region 160. In addition, when one barrier region B is between a pair of adjacent trench gates 160a-b, the barrier region B may be substantially at the center of the drift region 140 and/or the mesa M between the trench gates 160a-b, but is not limited thereto.

Figure 1:
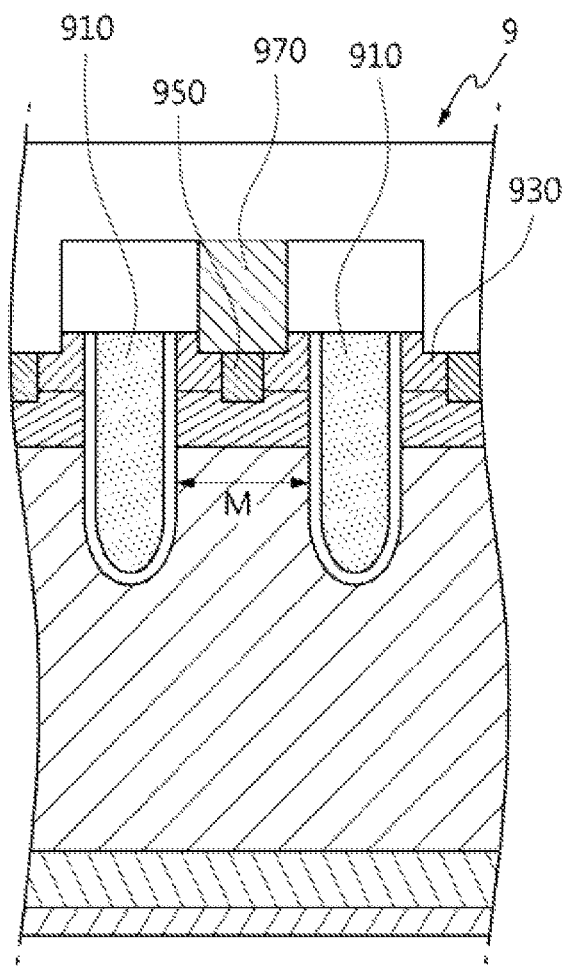
FIG. 1 is a cross-sectional view showing an insulated gate bipolar transistor in the related art.
Figure 2:
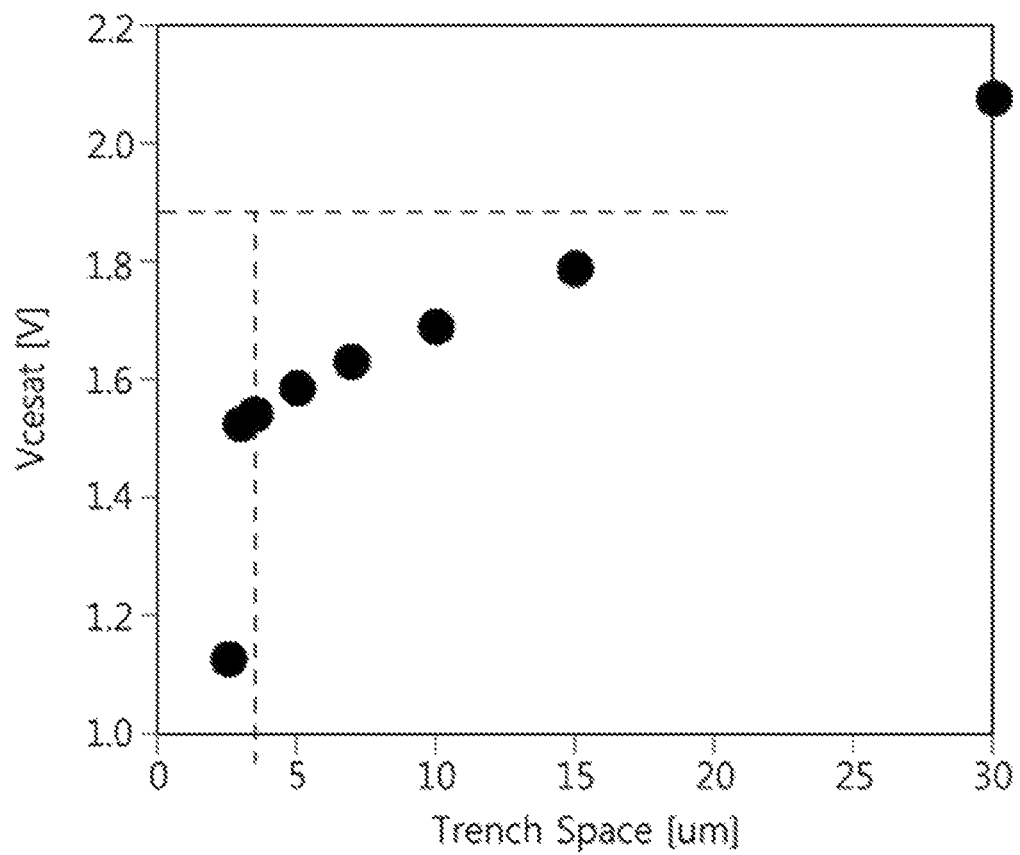
FIG. 2 is a graph showing that conductivity modulation increases according to the width of the mesa.

Therefore, the first current path C1 is between the first trench gate 160a and the barrier region B, and the second current path C2 is between the barrier region B and second trench gate region 160b. The first and second current paths C1 and C2 may have a size that is approximately the same or smaller than that of the existing mesa M (e.g., in the related art IGBT 9 [FIG. 1]).

For example, when the width of each of the first and second current paths C1 and C2 is approximately the same as the width of the existing mesa M, conductivity modulation may still be maximized, and at the same time, the distance between trench gates 160a and 160b increases relative to the related art IGBT 9, thereby securing sufficient space between the trench gates 160a and 160b to form the emitter 181, the ion implantation region 183, and the emitter electrode 190. Therefore, there is an advantage of promoting the ease of subsequent processing for forming the emitter 181 and other structures in the mesa M.

In addition, when the width of each of the first and second current paths C1 and C2 is less than the width of the existing mesa M, and the distance between adjacent trench gates 160a and 160b is equal to or larger than the width of the related art mesa M, it is possible to achieve easier subsequent processing and hole carrier accumulation.

One barrier region B may be between adjacent trench gates 160, or a plurality of barrier regions B may be between adjacent trench gate regions 160, as shown in FIG. 4.

Assuming that, for example, two to five barrier regions B are formed in the drift region 140, a wider distance may be secured between the adjacent trench gates 160a-b to further facilitate subsequent processing and/or make narrower the distance between adjacent barrier regions B and/or between an outermost barrier region B and the nearest trench gate 160a or 160b, whereby there is an effect of enabling the accumulation of hole carriers (e.g., in an even larger number of conduction paths). It should be noted that substantially the same distance may be between adjacent ones of the plurality of barrier regions B, but the invention is not limited thereto.

FIGS. 5 to 13 are cross-sectional views illustrating an exemplary method of manufacturing an insulated gate bipolar transistor according to one or more embodiments of the present invention.

Hereinafter, a method of manufacturing an insulated gate bipolar transistor, according to embodiments of the present invention will be described in detail with reference to the accompanying drawings.

Figure 5:
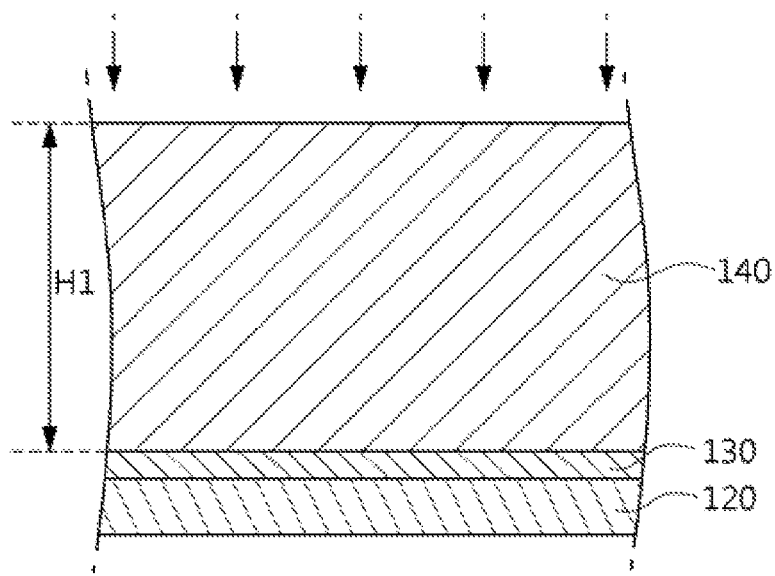
FIGS. 5 to 13 are schematic cross-sectional views showing an exemplary method of manufacturing an insulated gate bipolar transistor according to one or more embodiments of the present invention.
Figure 6:
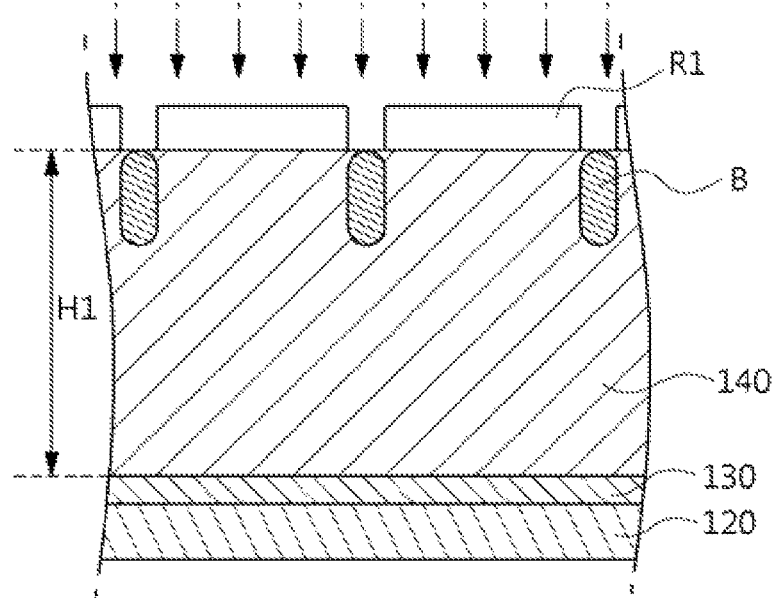
Figure 7:
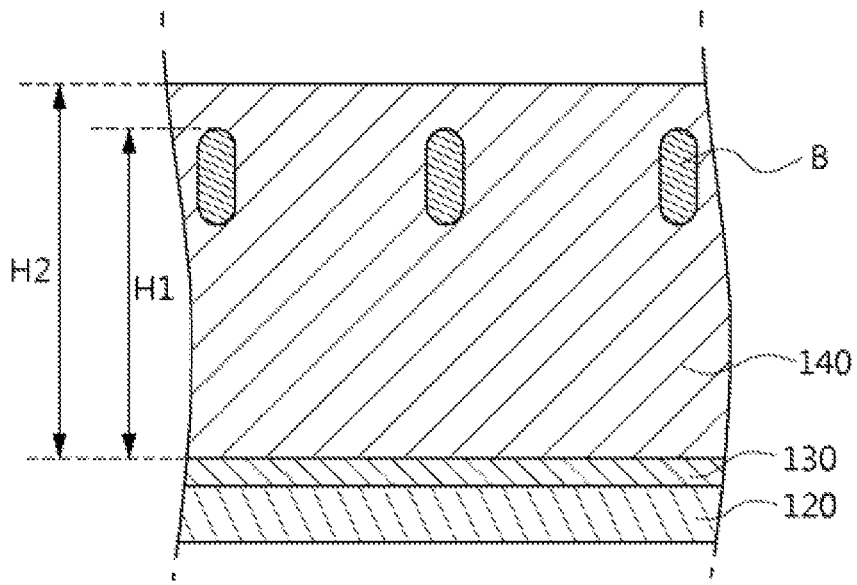

First, referring to FIG. 5, for example, a buffer layer 130 is formed on a collector layer 120 having a first conductivity type. For example, the buffer layer 130 may have a high concentration of second conductivity type impurities, and the buffer layer 130 may be formed by epitaxial growth.

Then, a drift region 140 is formed on the buffer layer 130. The drift region 140 may have a low concentration of second conductivity type impurities. The drift region 140 may also be formed by epitaxial growth.

More specifically, the drift region 140 may be formed by epitaxial growth to a first height H1. Thereafter, referring to FIG. 6, a first resist pattern R1 is formed on the drift region 140 having the first height H1, and a high concentration of a first conductivity type impurity is implanted into the surface of the drift region 140 through an opening in the pattern R1 (e.g., using the pattern R1 as a mask), thereby forming one or more barrier regions B. Thereafter, referring to FIG. 7, it is preferable to remove the first resist pattern R1 and to form the drift region 140 to a second height H2, by, for example, epitaxial growth. Here, the first height H1 is a height substantially equal to the uppermost surface of the barrier region B, and the second height H2 is greater than the first height H1.

Figure 8:
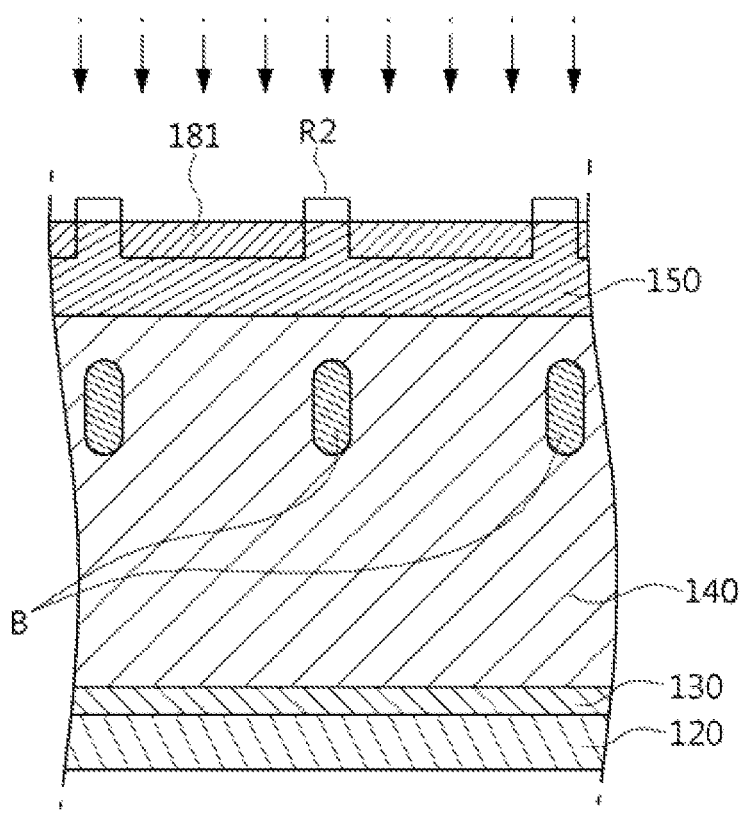

Then, referring to FIG. 8, a body region 150 is formed on the drift region 140. The body region 150 may be formed by, for example, implanting a first conductivity type impurity into the exposed surface of the drift region 140 and annealing the resulting structure in an oven or furnace. Alternatively, the body region 150 may be formed by further epitaxial growth, followed by ion implantation and annealing as described herein.

Then, a second resist pattern R2 (which may have a band-shaped opening therein) is formed on the surface of the body region 150, a high concentration of the second conductivity type impurities are implanted into the surface of the body region 150 using the pattern R2 as a mask, and then the second resist pattern R2 is removed. Through the implanted impurity and subsequent annealing, an implant region including the emitter 181 (which may have a band shape) is formed in the body region 150.

Figure 9:
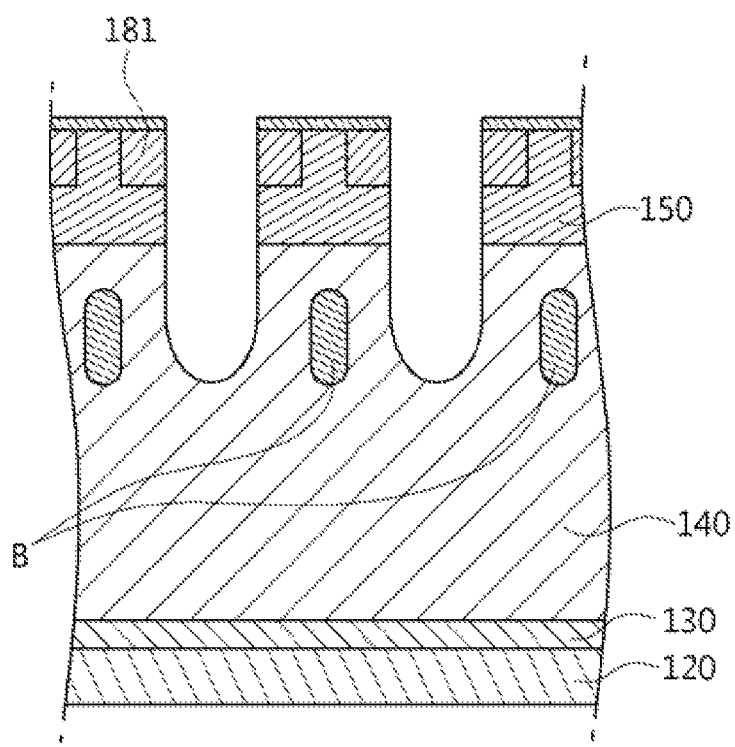

Subsequently, referring to FIG. 9, an oxide film is deposited and conventionally patterned to form a shield in the surface of the body region 150 and parts of the implant region. For example, the patterned oxide film forms an etching mask on the emitters 181 and parts of the body region 150 between the emitters 181. Then, an etching process may be performed through the openings in the patterned oxide film to form a trench that penetrates the body region 150 (e.g., from the uppermost surface of the body region 150) and that partially penetrates the drift region 140. After the process, the patterned oxide film is removed.

Figure 10:
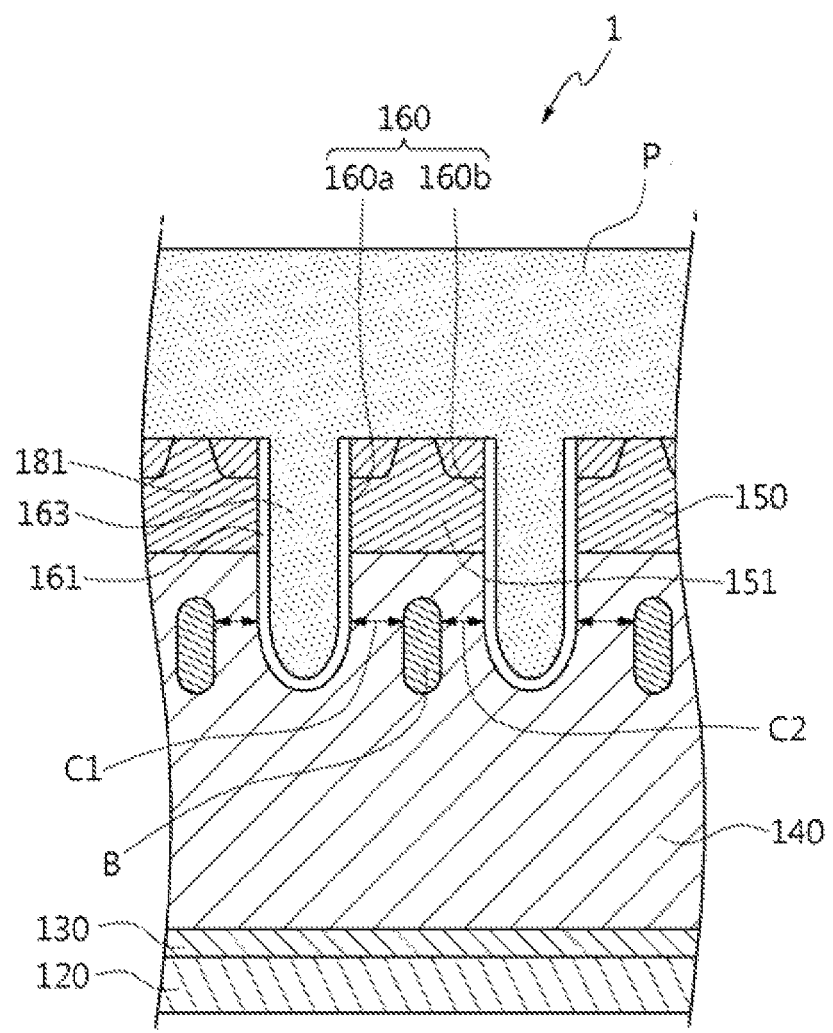

Referring to FIG. 10, an oxide film is formed or deposited on an exposed surface of the structure, including on the uppermost surfaces of the body region 150 and the emitters 181, and along the inner wall of the trenches to form the gate insulating film 161. Then, a polysilicon layer P doped with a second conductivity type impurity is deposited on the gate insulating film 161, filling the trenches. The gate insulating film 161 on the uppermost surface of the body region 150 may be removed (e.g., by mechanical or chemical-mechanical polishing) before depositing the polysilicon layer P. Alternatively, the polysilicon layer P outside of the trenches and the gate insulating film 161 on the uppermost surface of the body region 150 may be removed in the same polishing process (see, e.g., FIG. 11) to form the gate electrodes 163.

Figure 11:
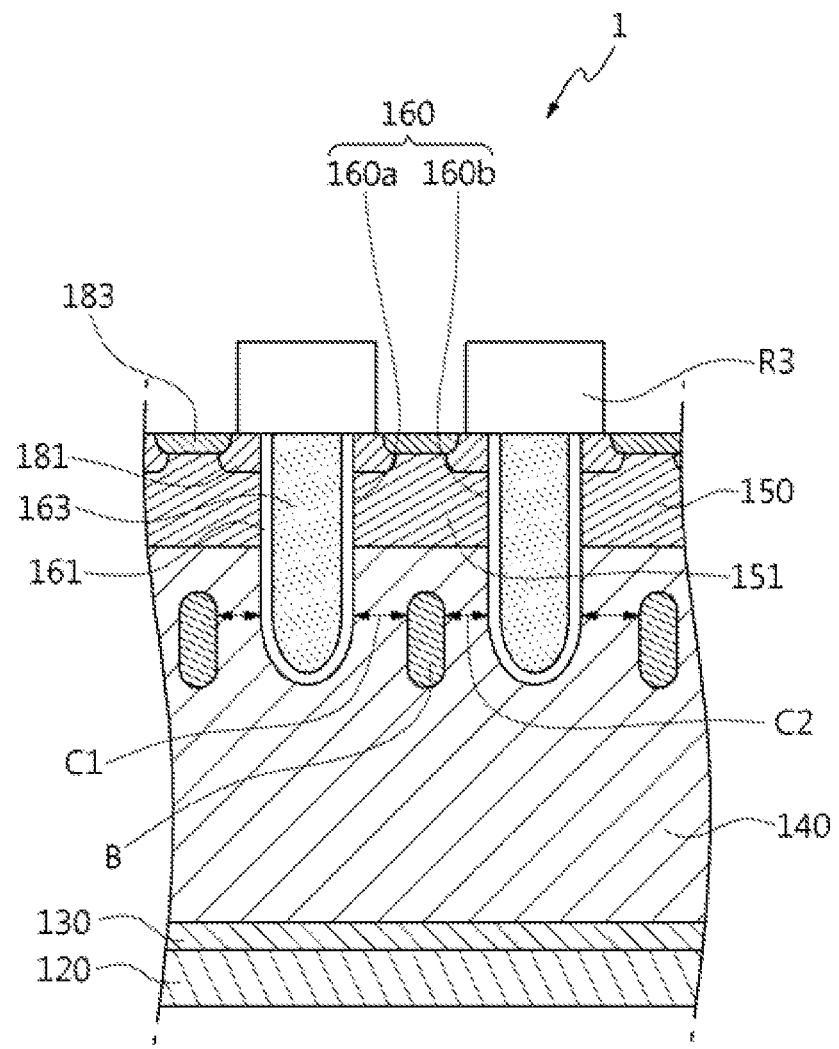

In subsequent processing, referring to FIG. 11, a third resist pattern R3 is formed on the uppermost surface of the gate electrodes 163, the gate insulating films 161, and a part of the emitters 181 adjacent to the gate insulating films 161, and a high concentration of the first conductivity type impurity is implanted into the body region 150 and exposed parts of the emitters 181 using the third resist pattern as a mask, and the third resist pattern R3 is removed. Then, the impurities in the ion implantation region 183 are activated by a heat treatment process (i.e., annealing). The ion implantation region 183 is in direct contact with the body region 150.

Figure 12:
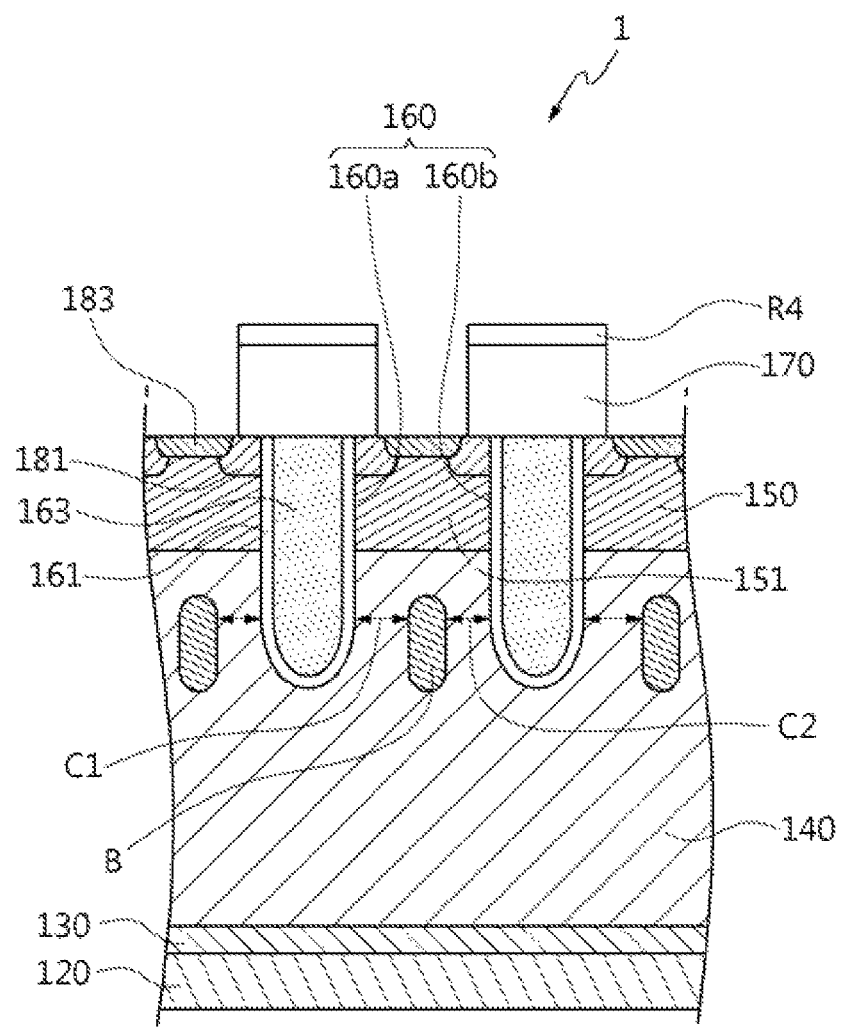

Thereafter, referring to FIG. 12, an insulating film (e.g., an interlayer insulating film 170) is deposited on the upper surfaces of the body region 150 and the gates 160. In addition, after a fourth resist pattern R4 is formed on the surface of the insulating film at locations that overlap the gates 160 except in locations for forming a gate contact (not shown), the insulating film is etched using the fourth resist pattern R4 as a mask. Thus, an interlayer insulating film 170 covering the surface of the trench gates 160 is formed. Then, the fourth resist pattern R4 is removed.

Figure 13:
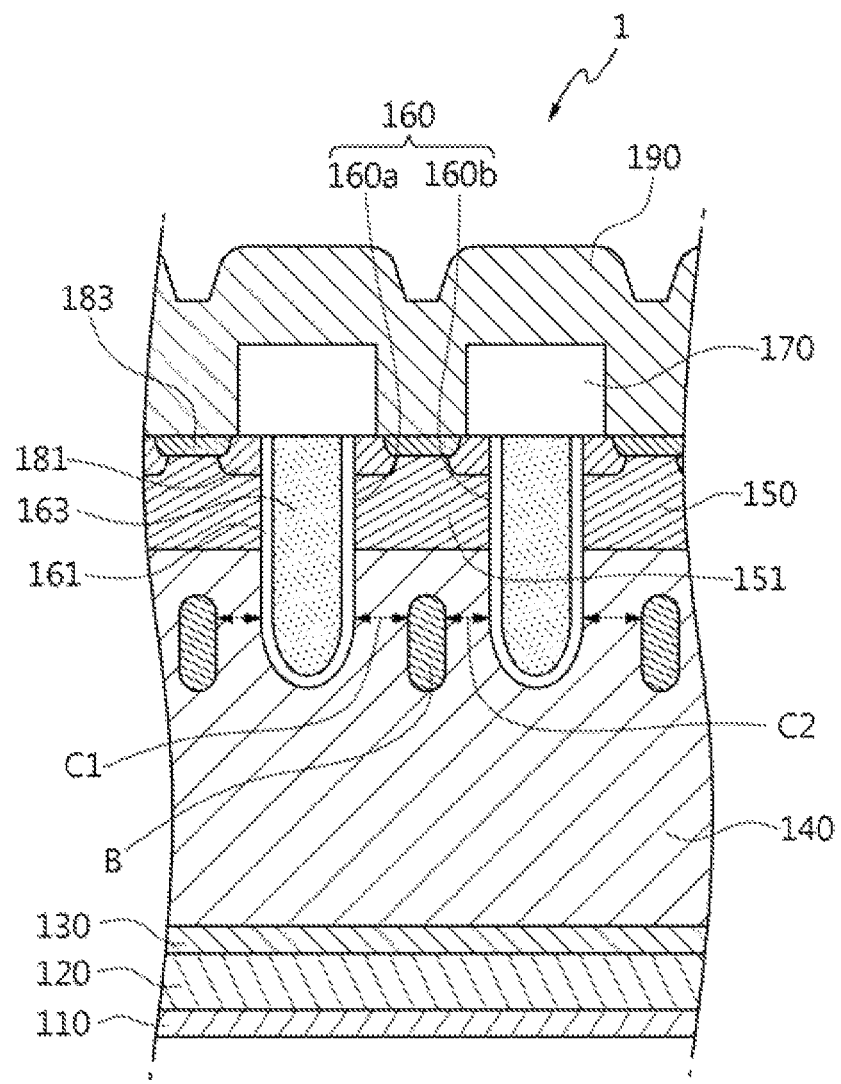

And, referring to FIG. 13, a gate wiring, a gate pad and/or an emitter electrode 190 may be formed by depositing a conductive layer 190 on the exposed ion implantation region 183, the emitter 181, and the interlayer insulating layer 170.

Finally, a collector electrode 110 is formed on the exposed (e.g., lowermost) surface of the collector layer 120. The collector electrode 110 may be or comprise a metal alloy of aluminum, such as AlMoNiAu, as described above.

The foregoing detailed description illustrates the present invention. In addition, the foregoing is intended to illustrate and explain the preferred embodiments of the present invention, and the present invention may be used in various other combinations, modifications, and environments. That is, it is possible to change or modify the scope of the concept of the invention disclosed in this specification, the scope of disclosure and the equivalent scope and/or the skill or knowledge of the present invention. The above-described embodiments illustrate the best mode for carrying out the technical idea of the present invention, and various modifications can be made in the specific applications and uses of the present invention. Therefore, the detailed description of the invention is not intended to limit the invention to the disclosed embodiments.

What is claimed is:

1. An insulated gate bipolar transistor, comprising:
   a collector electrode;
   a collector layer on the collector electrode, the collector layer having a first conductivity type;
   a buffer layer on the collector layer, the buffer layer having a second conductivity type;
   a drift region on the buffer layer, the drift region having the second conductivity type;
   a body region on the drift region, the body region the first conductivity type;
   a plurality of trench gates penetrating the body region;
   an interlayer insulating film covering a surface of the trench gates;
   emitters spaced apart from each other on a surface of the body region, the emitters having the second conductivity type; and
   a plurality of barrier regions in a mesa between adjacent trench gates, configured to divide a width of the mesa.

2. The transistor of claim 1, wherein the barrier region comprises a high concentration impurity region having the first conductivity type.

3. The transistor of claim 1, wherein the barrier region has a height that entirely or partially overlaps with the trench gates.

4. The transistor of claim 1, wherein adjacent ones of the barrier regions are separated by a substantially same distance.

5. The transistor of claim 1, further comprising:
   an ion implantation region having the first conductivity type and opposite ends or sides that are in contact or partially overlapping with the emitters and a bottom portion or surface that is in contact with the body region; and
   a polysilicon emitter electrode on the ion implantation region.

6. The transistor of claim 1, wherein the trench gate includes a gate insulating film along a boundary thereof; and a gate electrode doped with a second conductivity type impurity on the gate insulating film.

* * * * *